United States Patent
Krivanek et al.

(10) Patent No.: US 6,770,887 B2
(45) Date of Patent: Aug. 3, 2004

(54) ABERRATION-CORRECTED CHARGED-PARTICLE OPTICAL APPARATUS

(76) Inventors: Ondrej L. Krivanek, 2153 E. Beaver Lake Dr., Sammamish, WA (US) 98029; Peter D. Nellist, 11307 NE. 128th St., #G304, Kirkland, WA (US) 98034; Niklas Dellby, 5131 NE. 201 Pl., Lake Forest Park, WA (US) 98155

( * ) Notice: Subject to any disclaimer, the term of this patent is extended or adjusted under 35 U.S.C. 154(b) by 58 days.

(21) Appl. No.: 10/189,855

(22) Filed: Jul. 8, 2002

(65) Prior Publication Data

US 2004/0004192 A1 Jan. 8, 2004

(51) Int. Cl.[7] .............................. G21R 5/10; G21R 1/08; H01J 37/08
(52) U.S. Cl. ........................... 250/396 R; 250/396 ML; 250/492.1; 250/492.2; 250/492.22; 250/492.23; 250/310; 250/311
(58) Field of Search ................................ 250/307, 310, 250/311, 396 R, 396 ML, 397, 398, 492.1, 492.2, 492.21, 492.22, 305, 306; 356/401

(56) References Cited

U.S. PATENT DOCUMENTS

| | | | |
|---|---|---|---|
| 4,389,571 A | * 6/1983 | Crewe .................... 250/396 R |
| 4,414,474 A | 11/1983 | Crewe | |
| 4,743,756 A | * 5/1988 | Krivanek .................... 250/305 |
| 4,851,670 A | * 7/1989 | Krivanek .................... 250/305 |
| 4,896,036 A | * 1/1990 | Rose et al. ................. 250/310 |
| 4,962,313 A | * 10/1990 | Rose .......................... 250/311 |
| 5,041,724 A | * 8/1991 | Feuerbaum et al. ........ 250/307 |
| 5,084,622 A | * 1/1992 | Rose ....................... 250/396 R |
| 5,221,844 A | * 6/1993 | van der Mast et al. ..... 250/398 |
| 5,300,776 A | * 4/1994 | Krivanek .................... 250/307 |
| 5,378,917 A | * 1/1995 | Chalupka et al. ....... 250/492.21 |
| 5,640,012 A | * 6/1997 | Krivanek .................... 250/305 |
| 5,798,524 A | * 8/1998 | Kundmann et al. ......... 250/305 |
| 6,191,423 B1 | * 2/2001 | Krijn et al. ............. 250/396 R |
| 6,222,197 B1 | * 4/2001 | Kojima .................. 250/492.22 |
| 6,552,340 B1 | * 4/2003 | Krivanek et al. ........... 250/310 |
| 6,617,585 B1 | * 9/2003 | Stickel ................... 250/396 R |

OTHER PUBLICATIONS

O.L. Krivanek, N. Dellby and A.R. Upini, "Towards sub–Å electron beams" Ultramicroscopy vol. 78 (1999) p. 1–11.

N. Dellby et al., "Progress in aberration– corrected scanning transmission electron microscopy", Journal of Electron Microscopy vol. 50 (2001) p. 177–185.

Z. Snao, "On the fifth order aberration in a sextupole corrected probe forming system", Rev. Sci. Instrum. vol 59 (1988) p. 2429–2437.

* cited by examiner

Primary Examiner—John R. Lee
Assistant Examiner—David A. Vanore

(57) ABSTRACT

Aberration-corrected charged-particle optical apparatus improving the resolution of charged-particle optical systems by eliminating or minimizing optical aberrations. The apparatus comprises a source of charged particles and a plurality of charged-particle lenses including non-round lenses, energized in such manner so as to correct axial aberrations of orders up to and including fifth order. The non-round lenses comprise quadrupoles and octupoles disposed in such manner that fifth order combination aberrations are precisely controlled in addition to third order aberrations. The resultant apparatus very significantly improves on resolution attainable with non-aberration corrected charged-particle round lenses. It also improves on resolution attainable with correctors of third order aberrations only.

20 Claims, 4 Drawing Sheets

ABERRATION-CORRECTED CHARGED-PARTICLE OPTICAL APPARATUS

BACKGROUND OF THE INVENTION

1. Field of the Invention

The invention relates to charged-particle optical systems such as electron and ion probe-forming systems, electron and ion microscopes, and electron and ion microanalyzers. It relates particularly to high resolution scanning electron microscopes, high resolution scanning transmission electron microscopes, fixed-beam transmission electron microscopes, and to high resolution scanning ion microscopes, scanning ion microanalyzers, and further to focused ion beam systems used for sample erosion. It also relates to charged-particle optical systems used for lithography and mask writing.

2. Description of Prior Art

Round electromagnetic and electrostatic lenses normally used in electron and ion beam optical systems, hereafter referred to as charged-particle optical systems, suffer from unavoidable aberrations including spherical aberration and chromatic aberration. The aberrations can be overcome by aberration correctors comprising non-round lenses such as quadrupole and octupole lenses, as for instance described in an article entitled "Towards sub-Å electron beams" by O. L. Krivanek, N. Dellby and A. R. Lupini published in the journal Ultramicroscopy (volume 78, page 1–11), hereby incorporated by way of reference, and in an article entitled "Progress in aberration-corrected scanning transmission electron microscopy" by N. Dellby et al. published in the Journal of Electron Microscopy (volume 50, page 177–185), hereby also incorporated by way of reference. They can also be corrected by aberration correctors comprising sextupole lenses, as for instance described by Crewe in U.S. Pat. No. 4,414,474 and Rose in U.S. Pat. No. 5,084,622, hereby incorporated by way of reference.

Aberration correctors comprising quadrupole and octupole lenses have several important advantages compared to correctors comprising sextupole lenses. The primary effect of an octupole lens is to act directly on spherical aberration, which is a dominant aberration that unavoidably affects all round-lens charged-particle systems. By contrast, sextupole lenses, which are responsible for correcting spherical aberration in sextupole correctors, have the primary effect of producing strong three-fold astigmatism, a second order aberration. Correction of spherical aberration by a sextupole lens arises only as a by-product of the primary action, in a sextupole of extended length. As a result, at least two sextupoles must be used in a sextupole corrector, with the second sextupole appropriately energized so that it nulls three-fold astigmatism introduced by the first sextupole. Small misalignment between the two sextupoles, for instance introduced by a small variation of the strength of an alignment dipole, or a mechanical movement of the supporting column, results in the cancellation of the strong three-fold astigmatism not being complete. It typically leads to a large parasitic first order astigmatism, which adversely affects the attainable resolution. As a result, correctors utilizing sextupole lenses need to maintain higher stability and precision than quadrupole-octupole correctors in order to reach equivalent resolution.

Another important advantage of quadrupole-octupole corrector systems is that their quadrupoles may be constructed in such a way that they have negative chromatic aberration. As a result, a quadrupole-octupole corrector may be made to correct chromatic aberration in addition to geometric aberrations such as third order spherical aberration. Chromatic and spherical aberrations are typically the two most important aberrations of an uncorrected charged-particle optical system, and simultaneous correction of both the aberrations leads to considerably improved performance compared to optical systems that only correct one or the other aberration. By comparison, a sextupole corrector cannot correct chromatic aberrations unless it also incorporates extra quadrupole lenses, which do not lend themselves naturally to incorporation in a sextupole corrector.

Yet another major advantage of a quadrupole-octupole corrector system is that it does not need to use any round lenses within the corrector part of the system, since this part produces the required first order trajectories purely with quadrupole lenses. In contrast, sextupole correctors usually employ round lenses within the corrector. Magnetic quadrupole lenses typically consume less than 1% of the power required by round lenses of comparable focal length, and are therefore very efficient. As a result, large thermal loads which require water cooling, and which can easily lead to long-term drifts, are avoided by the use of quadrupole lenses rather than round lenses. This simplification leads to increased long-term stability, and simplified operation and maintenance of the charged-particle optical apparatus. A further advantage of quadrupole lenses is that unlike round lenses, they produce no image rotation, and this can lead to further simplifications in systems which use quadrupole lenses rather than round lenses disposed between strong multipole lenses such as sextupoles or octupoles.

On the other hand, a well-known advantage of sextupole correctors is that sextupoles correct spherical aberration uniformly in all directions that are transverse to the direction of travel of the charged-particle beam. This property makes possible sextupole correctors in which the action of the sextupoles is projected into the coma-free plane of the principal lens of the charged-particle apparatus, typically known as the objective lens. Such systems have minimized fifth order axial aberrations and also small field aberrations. They are not, however, completely free of fifth order aberrations, since six-fold astigmatism of fifth order typically remains uncorrected. An example of such a corrector system was described in an article entitled "On the fifth order aberration in a sextupole corrected probe forming system" by Z. Shao, published in the Review of Scientific Instruments (volume 59, page 2429–2437), hereby incorporated by way of reference.

Octupoles affect spherical aberration differently in different transverse directions. As a consequence, a quadrupole-octupole corrector typically comprises three or more octupole lenses, and the effective plane in which undesirable third order deviations of a ray leading through an optical system are corrected, hereafter called the correction plane, typically depends on the transverse direction of the ray. In such a system, it is typically impossible to project all the planes in which aberration correction takes place into a coma-free plane of the objective lens. Not projecting the correction planes into the coma-free plane of the objective lens leads to combination aberrations such as fifth order spherical aberration, two-fold astigmatism of fifth order and four-fold astigmatism of fifth order. These aberrations limit the improvement in the resolution performance of a typical charged-particle optical apparatus originally suffering from spherical aberration of third order, but corrected by a quadrupole-octupole aberration corrector, to two to three times better than the uncorrected performance, as described for instance in N. Dellby et al. in an article in the Journal of Electron Microscopy (reference cited above).

Most users of charged-particle optical systems would find significant advantage in an apparatus and a method allowing for complete cancellation of all fifth order aberrations with a quadrupole-octupole corrector system. Such an apparatus and method would improve the resolution by more than a factor of five compared to an uncorrected optical system, and more than a factor of two compared to an optical system utilizing an aberration corrector suffering from fifth order combination aberrations. The users would find significant advantage in the resultant improved resolution charged particle images that such an apparatus and method would provide, thereby enabling them to explore the structure of matter with hitherto unattainable resolution and sensitivity. They would also find advantage in the smaller diameter and more intense charged particle probes that such an apparatus and method would allow, thereby enabling users to explore matter at a higher resolution than hitherto possible, and to nano-machine matter with hitherto unattainable precision. They would further find a significant advantage in the greater immunity of a quadrupole-octupole corrector to misalignments and other instabilities than is typical with a sextupole-type corrector, the decreased power requirements of a quadrupole-octupole corrector compared to a sextupole corrector incorporating round lenses, and the absence of image rotation in a quadrupole-octupole corrector. Moreover, they would find a great advantage in the fact that a quadrupole-octupole corrector can also be made to correct chromatic aberration, thereby leading to a significant further improvement in the resolution of charged-particle images and to smaller charged-particle probes than can be attained with correctors correcting only geometric aberrations.

OBJECTS AND ADVANTAGES

Accordingly, several of the objects and advantages of the present invention are: to provide a method and an apparatus for a quadrupole-octupole corrector charged-particle optical system that is able to correct geometric aberrations up to fifth order, and to provide an apparatus and a method for correcting geometric aberrations up to fifth order while at the same time correcting chromatic aberration or aberrations. Another object and advantage of the present invention is to provide these aberration-correcting capabilities in an apparatus relatively insensitive to misalignments, instrumental drifts and other instabilities, and to provide them in an apparatus not using any high-power round lenses within the corrector part of the total apparatus, or not using any round lenses at all.

Readers will find further objects and advantages of the invention from a consideration of the ensuing description and of the accompanying figures.

BRIEF DESCRIPTION OF THE DRAWINGS

FIG. 1a shows axial trajectories of charged particles through the corrector apparatus. FIG. 1b shows field trajectories through the apparatus.

DRAWING REFERENCE NUMERALS

| | |
|---|---|
| 10 | optic axis |
| 11 | source of charged particles |
| 12 | corrector mid-plane |
| 20 | axial ray |
| 21 | axial ray in x-z plane |
| 22 | axial ray in y-z plane |
| 23 | field ray |
| 24 | field ray in x-z plane |
| 25 | field ray in y-z plane |
| 26 | double field crossover |
| 27 | double field crossover |
| 28 | double field crossover |
| 29 | double field crossover |
| 30 | beam-defining aperture |
| 31 | condenser lens |
| 32 | condenser lens |
| 33 | condenser lens |
| 34 | coupling lens |
| 35 | coupling lens |
| 36 | objective lens prefield |
| 37 | objective lens postfield |
| 38 | projector lens |
| 39 | projector lens |
| 40 | scan/align coil assembly |
| 41 | transmission sample |
| 42 | bulk sample |
| 43 | field crossover |
| 44 | field crossover |
| 45 | charged-particle detector |
| 46 | charged-particle detector |
| 47 | charged-particle detector |
| 48 | charged-particle detector |
| 49 | charged particles |
| 50 | aberration corrector |
| 51 | quadrupole lens |
| 52 | quadrupole lens |
| 53 | quadrupole lens |
| 55 | quadrupole lens |
| 56 | quadrupole lens |
| 57 | quadrupole lens |
| 61 | combined quadrupole-octupole lens |
| 62 | combined quadrupole-octupole lens |
| 63 | octupole lens |
| 64 | octupole lens |
| 68 | objective lens |
| 70 | coupling lens |
| 71 | coupling lens |
| 72 | projector lens |
| 73 | projector lens |
| 75 | two-dimensional image-detecting means |

DESCRIPTION

Figure 1A:
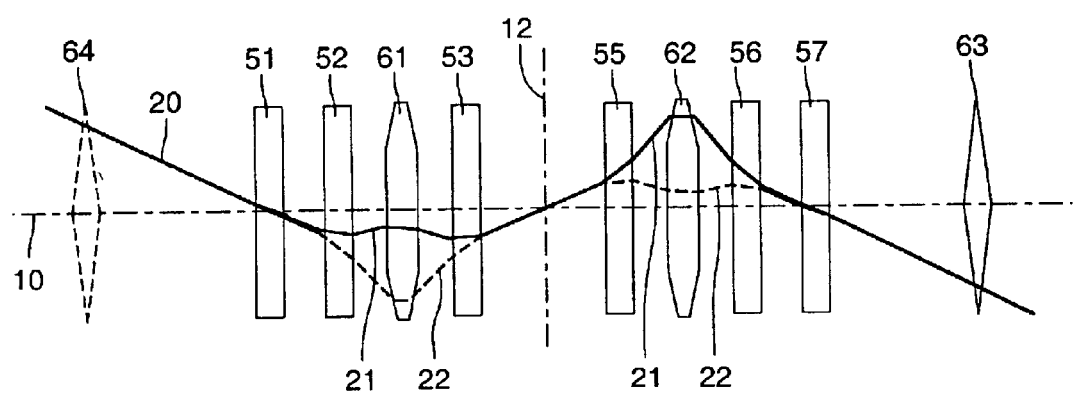
FIGS. 1a and 1b are schematic views of a quadrupole-octupole aberration corrector of the present invention comprising a plurality of quadrupole lenses and a plurality of octupole lenses.
Figure 1B:
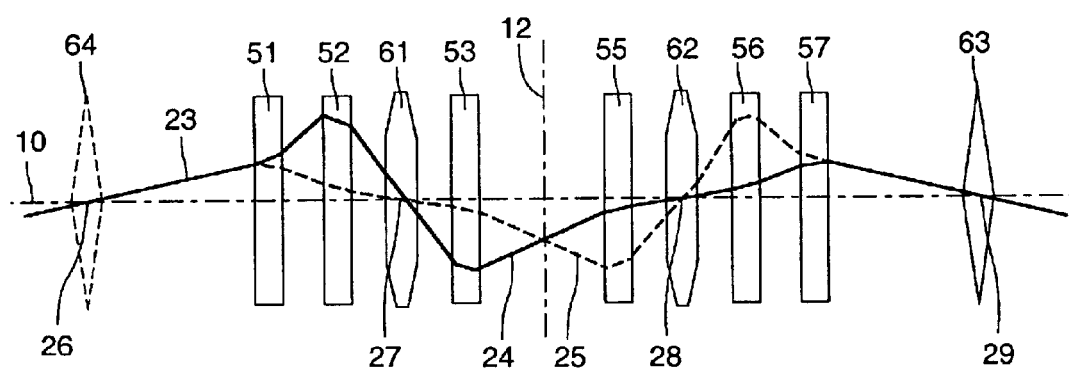

Referring now to FIGS. 1a and 1b, a charged-particle aberration corrector of the present invention is illustrated schematically. Such a corrector would normally be incorporated in the optical column of a probe-forming charged-particle optical apparatus, or in the column of an image-forming charged-particle optical apparatus utilizing a broad beam of charged particles.

A beam of charged particles enters the aberration corrector in a direction generally along optic axis 10, which is customarily taken to point in the positive z direction. The beam enters an assembly of quadrupole and octupole lenses comprising quadrupole lenses 51, 52, 53, 55, 56 and 57, combined quadrupole-octupole lenses 61 and 62, and octupole lens 63 and or octupole lens 64. The assembly acts on the first, third and fifth order focusing properties in an ideal system, and also the second, fourth, and higher order focusing properties in a real system in which physical misalignments and material and other inhomogeneities are present.

Although a detailed understanding of the functioning of such an assembly of lenses requires extensive computer modeling, a sound conceptual comprehension may be gained by tracing axial and field charged-particle trajectories through the optical system, as is normal practice in the art of charged-particle optics. FIG. 1a depicts schematically axial ray, also known as axial trajectory, 20. The ray is separated into axial ray 21 in the x-z plane and axial ray 22 in the y-z plane, i.e. in two different transverse directions, by the action of the quadrupole lenses of the correcting apparatus, and is again recombined into substantially identical axial rays in the last quadrupole of the aberration corrector. FIG. 1b depicts schematically field ray 23, which is separated into field ray 24 in the x-z plane and field ray 25 in the y-z plane inside the corrector. Any other charged-particle trajectory through the charged-particle optical system can be modeled to first order as a linear combination of the four trajectories 21, 22, 24 and 25.

As will be shown subsequently, axial rays 21 and 22 cross the optic axis at or near the plane of the sample, while field rays 24 and 25 cross the optic axis at or near the coma-free plane of the objective lens and traverse the sample plane away from the optic axis. Axial rays therefore depict how rays traversing the sample near the optic axis travel through the apparatus, while field rays depict how the correction planes are imaged onto each other.

Rays traversing the sample at a non-zero angle to the optic axis are affected by third and higher order axial aberrations. It is one of the objects of the present invention to correct these aberrations by the application of octupole fields of adjustable strength. Accordingly, axial rays 21 and 22 are arranged so as to traverse combined quadrupole-octupoles 61 and 62 some distance away from the optic axis, and likewise to traverse octupole 63 some distance from the optic axis. While traversing quadrupole-octupole 61, axial ray 22 is much further from the optic axis than axial ray 21. While traversing quadrupole-octupole 62, axial ray 21 is much further from the optic axis than axial ray 22. While traversing octupole 63, axial rays 21 and 22 are both approximately the same distance from the optic axis. This set of conditions allows three independent $3^{rd}$ order aberrations to be adjusted simply by changing the strength of the octupole fields in elements 61, 62 and 63. The adjustable aberrations are spherical aberration $C_{3,0}$, two-fold astigmatism of spherical aberration $C_{3,2}$, and four-fold astigmatism of spherical aberration $C_{3,4}$. The apparatus is thus able to set the spherical aberration $C_{3,0}$ to any desired value, including the value which optimally opposes spherical aberration introduced by other lenses in a complete charged-particle optical apparatus. Moreover, even though third order aberrations $C_{3,2}$ and $C_{3,4}$ become relatively strong inside the corrector, they can be readily adjusted by proper selection of the excitation of the corrector's octupoles so that they become zero at the exit of the corrector.

In order to avoid producing $5^{th}$ order combination aberrations as a by-product of correcting third order spherical aberration, the x-y correction planes in which third order aberrations are introduced by principal third order focusing elements must be successively imaged onto each other. This is achieved as follows: double field crossover 26 is imaged into double field crossover 27 in the center of quadrupole-octupole element 61, which is imaged into double field crossover 28 in the center of quadrupole-octupole element 62, again imaged into double field crossover 29 in the center of octupole 63, and finally, as will be shown subsequently, imaged into or near the coma-free plane of the objective lens of the complete optical apparatus.

Double crossovers 27 and 28 differ from double crossovers 26 and 29 in that in the former crossovers, field rays in the x-z and y-z planes have unequal angles to optic axis 10, whereas in the latter crossovers, field rays in the x-z and y-z planes have the same or similar angles to the optic axis. This means that the magnification with which preceding crossovers are imaged into crossovers 27 and 28 is different in different transverse directions, whereas the magnification at crossovers 26 and 29 is substantially the same for all transverse directions. As a result, axial rays traverse the third order elements 61 and 62 at distances from the optic axis that are different in different transverse directions, and third order element 63 (and or 64) at distances that are substantially the same for different transverse directions, as has already been noted. Fulfilling this condition allows a complete correction of third order aberrations in a charged-particle apparatus. At the same time, the correcting planes are precisely imaged onto each other. Fulfilling this condition allows higher order combination axial aberrations such as fifth order aberrations to be avoided. The two conditions have not previously been simultaneously fulfilled in a charged-particle aberration-corrected optical apparatus utilizing quadrupole and octupole lenses.

Readers skilled in the art of charged-particle optics will note other advantageous features of the present invention. As depicted in FIGS. 1a and 1b, the optical elements are arranged in three groups, the first group comprising quadrupoles 51, 52, and 53 and combined quadrupole-octupole 61, the second group comprising quadrupoles 55, 56 and 57 and combined quadrupole-octupole 62, and the third group comprising octupole 63 and or 64. The first group causes axial electron trajectories to be extended in one transverse direction and serves principally to correct third and fifth order aberrations in a corresponding transverse plane, the second group causes axial trajectories to be extended in a second transverse direction and serves principally to correct third and fifth order aberrations in a corresponding transverse plane. The third group acts on a round or a nearly round beam, and principally serves to correct four-fold astigmatisms of $3^{rd}$ and $5^{th}$ order. The readers will also note that the second transverse plane is normally perpendicular to the first transverse plane, but that this is not an essential requirement for aberration correction, and that angles other than 90 degrees between the first and second transverse planes, e.g. 60 degrees, may be employed. Further, the readers will note that the optical elements of the apparatus, with the exception of octupole 63, are arranged symmetrically with respect to the mid-plane 12, and further that mirror-related quadrupoles are excited antisymmetrically, that is for each quadrupole which is diverging in the x-z plane on one side of mirror plane 12, there is a corresponding quadrupole on the other side of mirror plane 12 that is converging in the x-z plane. Such a symmetry is desirable in that it allows several aberrations to be nulled by symmetry, and also because it simplifies the set-up of the apparatus. However, readers skilled in the art will also realize that in a practical apparatus, such symmetry is typically not attained precisely, and deviations from it serve to counter imperfections in machining and imprecision in the optical alignment of the apparatus. They will also note that as depicted in FIGS. 1a and 1b, the above-described first and second group of optical elements each comprises 3 quadrupole lenses and one combined quadrupole-octupole lens, and that further quadrupole and octupole lenses may be added to each group without significantly altering the nature of the invention. Moreover, they will also appreciate that octupole 63 located at field crossover 29 may be replaced by octupole 64 located at field crossover 26, or both octupoles 63 and 64 may be utilized simultaneously.

Figure 2:
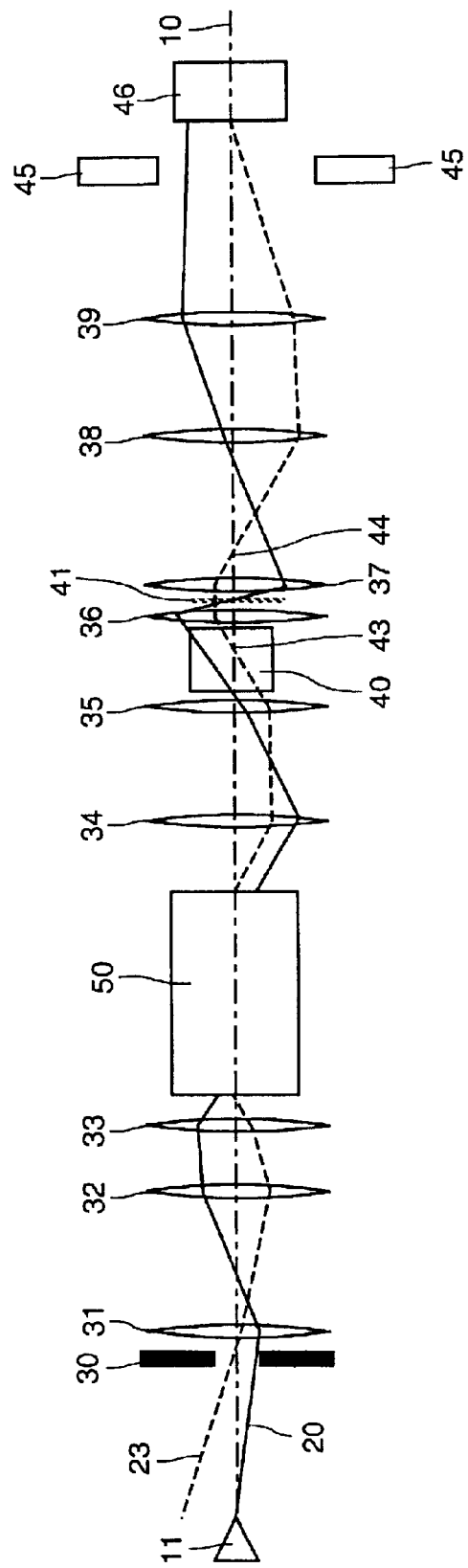
FIG. 2 is a schematic view of a charged-particle probe-forming apparatus of the present invention comprising a source of charged particles, a beam-defining aperture, a plurality of condenser lenses, a quadrupole-octupole aberration corrector, a plurality of coupling lenses, a scan/align coil assembly, a probe-forming lens comprising a pre-field lens and a post-field lens, a sample, a plurality of detector coupling lenses and a plurality of detectors.

FIG. 2 illustrates schematically how the aberration corrector of the invention may be incorporated into a charged-particle optical column of a probe forming system using round lenses and transmission samples. A source of charged particles 11 emits a beam of charged particles generally along the direction of optic axis 10. The beam is defined in angle by a beam-defining aperture 30, and conditioned in its angular range, source magnification and apparent source height by condenser lenses 31, 32 and 33. The beam then enters an aberration corrector 50 whose internal construction and ray paths were illustrated schematically in FIGS. 1a and 1b. Upon exiting the corrector, the beam traverses coupling lenses 34 and 35, and further a scan/align coil assembly 40. It then enters an objective lens shown schematically as consisting of probe-forming objective lens prefield 36 and postfield 37, with transmission sample 41 situated within the lens. The beam then traverses coupling lenses 38 and 39 and is incident upon detectors 45 and 46. Suitable detectors well known in the art comprise bright field and dark field detectors, and also 2-dimensional TV or CCD cameras, which capture the angular distribution of the charged particles.

Axial ray 20 leaves source 11 near optic axis 10, traverses aberration-correcting apparatus 50 as illustrated in FIG. 1a, and arrives at sample 41 on or near axis 10, due to the combined action of coupling lenses 34 and 35 and objective lens prefield 36. Field ray 23 leaves source 11 some distance from axis 10, traverses aberration-correcting apparatus 50 as illustrated in FIG. 1b, and subsequently crosses optic axis 10 at field crossover 43. By adjusting the strength of coupling lenses 34 and 35 appropriately, field crossover 43 may be made to coincide with the so-called coma-free plane of the objective lens prefield 36. The coma-free plane can be viewed as the effective plane in which undesirable third order aberrations of the objective lens prefield 36 are introduced. Since field ray 23 crosses axis 10 in this plane, principal third order focusing elements, namely octupoles 61, 62 and 63 depicted in FIG. 1 are imaged onto the coma-free plane. This is the condition that must be satisfied in order to null $5^{th}$ order combination aberrations, which would otherwise arise due to different third order aberration-causing elements not being precisely imaged onto each other. When the octupoles are not imaged onto the coma-free plane, the coefficient of fifth order combination aberration is given by:

$$C_{5comb}=3C_3^2L/f^2 \quad [1]$$

where $C_3$ is the coefficient of third order aberration of the objective lens prefield which is being nulled by the action of the aberration corrector, f the focal length of the objective lens prefield, and L the distance between the plane into which an image of the aberration-correcting elements is imaged and the coma-free plane of the objective lens prefield.

In a quadrupole-octupole aberration-correcting apparatus not optimized for $5^{th}$ order aberrations, the distance L may vary for different transverse directions, and in this way additional aberrations such as $C_{5,2}$ and $C_{5,4}$ may be excited. However, when L is zero or the same in all transverse directions simultaneously, these additional aberrations will not be introduced. Making L small but not zero allows $C_{5comb}$ to be adjusted as needed, for instance to compensate for the small $C_5$ aberration that is typically contributed by individual round and quadrupole lenses for charged particles, or to set the total $5^{th}$ order aberration of the apparatus $C_{5total}$ total to a value that optimally opposes the next uncorrected aberration coefficient, typically $7^{th}$ order spherical aberration $C_7$.

The value of L that produces the strength of the $5^{th}$ order combination aberration that properly nulls the intrinsic $C_{5int}$ of the optical apparatus is given by:

$$L=-C_{5int}f^2/(3C_3^2) \quad [2]$$

where negative values of L mean that the aberration-correcting elements are imaged into a plane situated downstream from the coma-free point of the objective lens prefield.

As an example of the size of L required to null $C_{5int}$, assume that the aberration coefficient arising from the uncorrected intrinsic $5^{th}$ order aberrations due to the combined action of all the individual lenses of the apparatus is equal to the focal length of the objective lens f, and that the $3^{rd}$ order aberration coefficient due to the combined action of all the lenses of the apparatus $C_3$ is also equal to f. Inserting these values into expressions [1] and [2] above shows that setting L to –f/3 results in a value of $5^{th}$ order combination aberration C5comb that precisely cancels the intrinsic $5^{th}$ order aberration $C_{5int}$ of the optical apparatus of the invention. Since focal lengths of objective lenses used in charged-particle optics are typically equal to a few mm, whereas the distance between lenses in a charged-particle optical systems tends to be of the order of 100 mm, the example makes it clear that a relatively small adjustment away from the precise imaging of the correcting planes of the corrector onto the coma-free plane of the objective lens readily achieves the desired $5^{th}$ order correction. A further small adjustment of the imaging of the octupoles in the same direction may additionally be used to produce a small negative $C_{5total}$, of such magnitude as to optimally oppose uncorrected $7^{th}$ order axial aberration $C_7$ of the total apparatus.

It is worth noting that because quadrupole-octupole correctors do not introduce any six-fold astigmatism of $5^{th}$ order ($C_{5,6}$), the optical system of the present invention may be made free of all axial aberrations up to and including all $5^{th}$ order axial aberrations, or adjusted so that its first, third and fifth order aberrations optimally oppose uncorrected seventh order aberrations. This is not possible with present-day sextupole correctors, which introduce non-negligible six-fold astigmatism of $5^{th}$ order ($C_{5,6}$)

The first uncorrected geometric aberration of the above-described system is spherical aberration of $7^{th}$ order $C_7$. Detailed computer simulations show that in a practical aberration-correcting apparatus, this aberration will typically amount to about 1 cm. The simulations further show that in the case of a charged-particle aberration-correcting optical apparatus designed to focus an electron beam into a small probe, the aberration-limited size of a $C_7$-limited probe will be about 0.2 Å for 200 kV electrons. This is about a factor of 4 smaller than has hitherto been achieved with electron-optical systems of any kind. In the highly refined art of electron optics, 3 Å probe size was reached in about 1970, and the present smallest probe size record of 0.8 Å was only reached in 2001. This shows that the present invention promises to advance this field by a factor equal to that produced by the combined developments of the previous 30 years.

Attainment of the 0.2 Å probe size will only be possible provided that either the energy spread of the electron beam is smaller than about 0.2 eV, or that chromatic aberration is also corrected in addition to the geometric aberrations discussed herein. Readers skilled in the art will appreciate that in a quadrupole-octupole aberration-correcting apparatus, axial chromatic aberration of the first order may be corrected by the use of a combination of electrostatic and electromagnetic quadrupoles, or by combined electrostatic-electromagnetic quadrupoles, whose excitations are adjusted to produce negative chromatic aberration, so as to compensate for the positive chromatic aberration intrinsic to uncorrected lenses of the apparatus. Only two combined quadrupoles are needed, and they may be inserted at any location in a charged-particle optical apparatus where the rays are at substantially different distances in different transverse directions from optic axis 10. In the apparatus of the present invention, this occurs at or near optical elements 61 and 62. Using combined electrostatic-electromagnetic quadrupoles plus octupoles in these locations therefore allows first order chromatic aberration to be corrected at the same time as all geometric aberrations up to and including $5^{th}$ order. The chromatic aberration-correcting elements may also be introduced elsewhere in the apparatus, either within or outside the aberration corrector 50.

Figure 3:
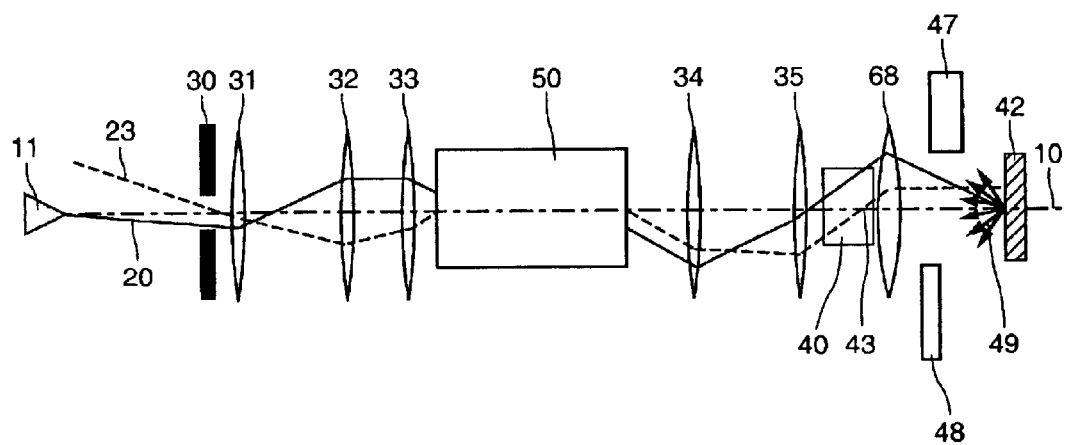
FIG. 3 is a schematic view of a charged-particle probe-forming apparatus of the present invention comprising a source of charged particles, a beam-defining aperture, a plurality of condenser lenses, a quadrupole-octupole aberration corrector, a plurality of coupling lenses, a scan/align coil assembly, a probe-forming lens, a sample, and a plurality of detectors.

FIG. 3 illustrates schematically how the aberration-correcting apparatus of the invention may be incorporated into a charged-particle optical column of a probe forming system using round lenses and bulk samples. A charged particle source 11 emits a beam of charged particles generally along the direction of optic axis 10. The beam is defined in angle by a beam-defining aperture 30, and conditioned in its angular range, source magnification and apparent source height by condensers 31, 32 and 33. The beam then enters an aberration-correcting apparatus 50 whose internal construction was illustrated schematically in FIGS. 1a and 1b. Upon exiting the correcting apparatus the beam traverses coupling lenses 34 and 35, and further a scan/align coil assembly 40. It then enters an objective lens 68, and is incident on bulk sample 42. Secondary or back-scattered charged particles 49 emanating from the area of sample 42 illuminated by the incident beam are detected by detectors 47 and 48. Suitable detectors comprise secondary charged-particle detectors and backscattered charged-particle detectors.

The entire apparatus is schematically identical, up to the plane of the sample, to a probe-forming apparatus using transmission samples as illustrated in FIG. 2. Field trajectory 23 is made to cross the optic axis 10 at a double crossover 43 located at or near the coma-free plane of the objective lens 68, and in this way aberrations of $5^{th}$ order are either minimized or altogether eliminated. Similar to a probe-forming apparatus utilizing transmission samples, a combination of electrostatic and electromagnetic quadrupoles or combined electrostatic-electromagnetic quadrupoles may be introduced within the aberration corrector 50 or elsewhere in the apparatus, and in this way first order chromatic aberration may be corrected in addition to purely geometric aberrations.

Figure 4:
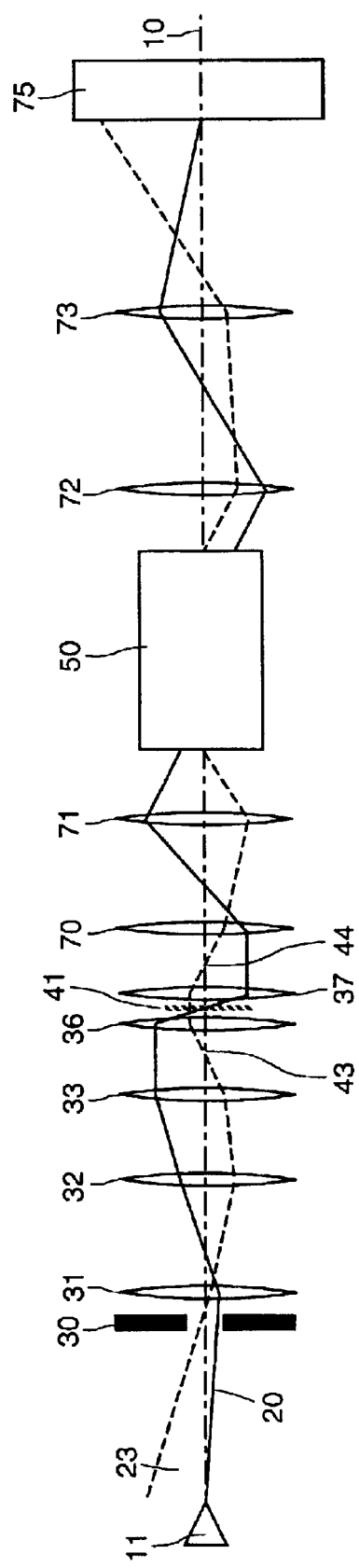
FIG. 4 is a schematic view of a charged-particle imaging apparatus of the present invention comprising a source of charged particles, a beam-defining aperture, a plurality of condenser lenses, an objective lens comprising a pre-field lens and a post-field lens, a sample, a plurality of coupling lenses, a quadrupole-octupole aberration corrector, a plurality of imaging lenses and an image detecting means.

FIG. 4 illustrates schematically how the aberration-correcting apparatus of the invention may be incorporated into a charged-particle optical column of a fixed-beam imaging system using round lenses and transmission samples. Such a system images a transmission sample 41 onto a two-dimensional detector 75. Consequently, it is the performance of the post-sample imaging optics that is important, and an aberration corrector 50 is situated within this part of the optical column. A charged-particle source 11 emits a beam of charged particles generally along the direction of optic axis 10. The beam is defined in angle by a beam-defining aperture 30, conditioned by condensers 31, 32 and 33, and it is then projected by objective lens prefield 36 onto transmission sample 41. The beam transmitted though the sample is imaged by a broad-beam objective lens postfield 37 and coupling lenses 70 and 71 into aberration corrector 50, and then imaged by projector lenses 72 and 73 onto two-dimensional image-detecting means 75.

In order to minimize or eliminate fifth order geometric aberrations, the field trajectories are so managed that a field crossover 44 occurring at or near the coma-free plane of postfield 37 is imaged into field crossovers disposed within the aberration corrector 50 as illustrated in FIG. 1b. The actual x-y plane that is imaged into the octupoles of the corrector 50 is typically chosen to lie near a distance $L=C_5f^2/(3\ C_3^2)$ in front of the coma-free point of objective lens post-field 37, and in this way the total fifth order aberration coefficient of the optical system is either nulled or adjusted to optimally oppose uncorrected higher order aberrations.

Imaging all the principal third order focusing elements of the optical column onto each other also provides for minimized field aberrations. In a fixed-beam imaging apparatus in which many sample points are imaged at the same time, this is an important and desirable property. Further, similar to the probe-forming optical systems described above, quadrupoles within the aberration corrector or disposed elsewhere in the apparatus may be made from combined electrostatic and electromagnetic elements, or quadrupoles of both electrostatic and electromagnetic construction may be used within the total apparatus, and in this way the first order chromatic aberration of the system corrected in addition to the geometric aberrations.

Readers skilled in the art will appreciate that performance-enhancing modifications to the aberration-correcting apparatus and method described herein are readily possible, without deviating from the principles and methods outlined here. For example, additional quadrupoles may be utilized in the apparatus giving advantages such as easier set-up and variable first order focusing, and greater flexibility in the available set of trajectories satisfying conditions necessary for aberration correction. Moreover, combined quadrupole-octupole elements 61 and 62 may each be replaced by a separate quadrupole or a group of quadrupoles plus octupole or octupoles, and octupoles 63 or 64 may be replaced by combined quadrupole-octupole elements, without substantially deviating from the principles and methods described above. Additional octupoles may be introduced in the apparatus, and if the centers of the combined action of local octupole groups affecting different third order aberrations are projected near or onto a double field crossover, the functioning of the apparatus will not be significantly altered.

Moreover, in a practical aberration-correcting apparatus, additional multipoles including dipoles, rotated quadrupoles, sextupoles and other higher order multipoles will typically be disposed within the apparatus, either as stand-alone elements or in combination with other multipoles, thereby facilitating alignment, without significantly affecting the aberration-correction functioning of the apparatus. Furthermore, the mirror symmetry of the aberration corrector 50 may be broken without compromising its ability to correct aberrations, provided again that the arrangement of field crossovers described above is not substantially compromised. Readers skilled in the art will also appreciate that further flexibility may be gained by situating additional round lenses or apertures within the optical systems described here, for instance by increasing the number of coupling lenses disposed between the aberration corrector and the objective lens, without significantly affecting the principles and methods of the apparatus of the invention. They will also appreciate that the optical systems depicted in FIGS. 2 and 4 may be combined into one system comprising aberration correctors of the present invention correcting the aberrations of both a probe-forming and an image-forming part of an optical apparatus.

Furthermore, readers skilled in the art will also appreciate that the aberration corrector depicted in FIGS. 1a and 1b may be used by itself as a final probe-forming lens in an apparatus not relying on a round lens or lenses to focus a probe, and that in this case octupole 64 will be employed in preference to octupole 63, and quadrupole 57 may be altogether omitted without appreciably affecting the aberration-correcting properties of the apparatus of the invention. They will also appreciate that the aberration corrector depicted in FIGS. 1a and 1b may be used in place of a first imaging lens in an imaging apparatus not relying on a round lens or lenses to produce a first intermediate image. The readers will also appreciate that the aberration corrector depicted schematically in FIGS. 1a and 1b may be used with a much wider variety of charged-particle lens systems than those shown schematically in FIGS. 2 to 4. Such systems may comprise lens-optical combinations not including any round lenses, but achieving first order focusing by the use of quadrupole lenses, bending prisms, Wien filters, or charged particle mirrors. In such systems, the locations of the coma-free planes of the principal probe-forming or image-forming optical elements may be different in different transverse planes, and the principal third order focusing elements of the aberration corrector 50 will be projected into these planes.

What is claimed is:

1. Aberration-correcting charged-particle optical apparatus comprising:
    a source of charged particles;
    a beam-defining aperture means;
    a plurality of condenser lenses;
    an aberration corrector comprising eight or more quadrupole lenses and three or more octupole lenses, one or more of which may be combined quadrupole/octupole lenses;
    a plurality of coupling lenses;
    a probe-forming lens comprising a coma-free plane; and
    a sample,
    in which said quadrupole lenses are so energized as to image three or more of said octupole lenses onto each other with different magnifications in different transverse directions, and said octupole lenses are energized so that axial aberrations of third order are eliminated and axial aberrations of fifth order are rendered small.

2. Charged-particle apparatus of claim 1 in which said octupole lenses are collectively imaged into or near said coma-free plane of said probe-forming lens of said apparatus, whereby fifth order axial aberrations and field aberrations are minimized.

3. Charged-particle apparatus of claim 1 in which said octupole lenses are collectively imaged into or near a plane distant by $L=C_5 f^2/(3\, C_3^2)$ from the coma-free plane of said probe-forming lens of said apparatus, where $C_5$ is the combined coefficient of fifth order spherical aberration of said optical apparatus when said octupole lenses are imaged precisely into said coma-free plane of said probe-forming lens, f is the focal length of said probe-forming lens of said apparatus, and $C_3$ is the coefficient of third order spherical aberration of said probe-forming lens, whereby aberrations of fifth order are either eliminated or adjusted to optimally oppose higher order aberrations.

4. Charged-particle apparatus of claim 1 additionally comprising both electromagnetic and electrostatic quadrupoles or combined electromagnetic-electrostatic quadrupoles, one or more of which may additionally comprise octupole fields, wherein first-order chromatic aberrations are corrected in addition to geometric aberrations.

5. Charged-particle apparatus of claim 1 in which said aberration corrector comprises a first group of lenses comprising, in turn, four or more quadrupole lenses and at least one octupole or combined quadrupole/octupole lens acting primarily on a beam more extended in one transverse direction and affecting mostly aberrations in a corresponding transverse plane, a second group of lenses comprising four or more quadrupole lenses and at least one octupole or combined quadrupole/octupole lens acting primarily on a beam more extended in a second transverse direction and affecting mostly aberrations in a corresponding transverse plane, and a third group of lenses comprising at least one octupole or combined quadrupole/octupole lens acting on a round or nearly round beam.

6. Charged particle apparatus of claim 5 in which said three groups of lenses are arranged such that the group acting on a round or a nearly round beam is situated near the center of said corrector and is preceded and followed by groups of lenses acting on non-round beams.

7. Charged-particle apparatus of claim 1 in which said condenser lenses and said coupling lenses are round lenses.

8. Charged-particle apparatus of claim 1 in which said condenser lenses and said coupling lenses are quadrupole lenses.

9. Charged-particle apparatus of claim 1 wherein said source of charged particles is an electron source and said sample is a thin transmission sample.

10. Charged-particle apparatus of claim 1 wherein said source of electrons is an electron source and said sample is a bulk sample.

11. Charged-particle apparatus of claim 1 wherein said source of charged particles is an ion source.

12. Aberration-correcting charged-particle optical apparatus comprising:
    a source of charged particles;
    a beam-defining aperture means;
    a plurality of condenser lenses;
    a transmission sample;
    a broad-beam objective lens comprising a coma-free plane;
    a plurality of coupling lenses;
    an aberration corrector comprising eight or more quadrupole lenses and three or more octupole lenses, one or more of which may be combined quadrupole/octupole lenses;
    a plurality of projector lenses; and
    a two-dimensional image detecting means
    in which said quadrupole lenses are so energized as to image three or more of said octupole lenses onto each other with different magnifications in different transverse directions and said octupole lenses are energized so that geometric aberrations of third order are eliminated, and geometric aberrations of fifth order and field aberrations are minimized.

13. Charged-particle apparatus of claim 12 in which a plane distant by $L=C_5f^2/(3C_3^2)$ from said coma-free plane of said objective lens of said apparatus is successively imaged into or near the center of at least three of said octupole lenses with different transverse magnifications, where $C_5$ is the combined coefficient of fifth order spherical aberration of said optical apparatus when said coma-free plane of said objective lens is imaged precisely into said centers of said octupole lens, f is the focal length of said objective lens, and $C_3$ is the coefficient of third order spherical aberration of said objective lens, whereby aberrations of fifth order are either eliminated or adjusted to optimally oppose higher order aberrations.

14. Charged-particle apparatus of claim 12 additionally comprising both electromagnetic and electrostatic quadrupoles or combined electromagnetic-electrostatic quadrupoles, wherein first order chromatic aberrations are corrected in addition to geometric aberration.

15. Charged-particle apparatus of claim 12 in which said aberration corrector comprises a first group of lenses comprising, in turn, four or more quadrupole lenses and at least one octupole or combined quadrupole/octupole lens acting primarily on a beam more extended in one transverse direction and affecting mostly aberrations in a corresponding transverse plane, a second group of lenses comprising four or more quadrupole lenses and at least one octupole or combined quadrupole/octupole lens acting primarily on a beam more extended in a second transverse direction and affecting mostly aberrations in a corresponding transverse plane, and a third group of lenses comprising at least one octupole or combined quadrupole/octupole lens acting on a round or nearly round beam.

16. Charged particle apparatus of claim 15 in which said three groups of lenses are arranged such that the group acting on a round or nearly round beam is situated near the center of said corrector and is preceded and followed by groups of lenses acting on non-round beams.

17. Charged-particle apparatus of claim 12 wherein said source of charged particles is an electron source.

18. A method of aberration correction for charged-particle optical systems which comprise an objective lens and an aberration corrector comprising eight or more quadrupole lenses and three or more octupole lenses, one or more of which may be combined quadrupole/octupole lenses, wherein said quadrupoles are energized so that said octupole lenses are imaged onto each other with different magnifications in different transverse directions, and said octupole lenses are energized so that axial aberrations of third order are eliminated and axial aberrations of fifth order are minimized.

19. Method of aberration correction of claim 18 wherein said octupole lenses are imaged near a coma-free plane of said objective lens, whereby axial fifth order aberrations are either eliminated or adjusted to optimally oppose uncorrected aberrations of higher orders, or field aberrations are minimized.

20. Method of aberration correction of claim 18 wherein additional electromagnetic and electrostatic quadrupoles or combined electromagnetic-electrostatic quadrupoles are used to correct chromatic aberrations in addition to geometric aberrations of third and fifth order.

* * * * *